US011084979B2

United States Patent
Matsuda et al.

(10) Patent No.: US 11,084,979 B2
(45) Date of Patent: Aug. 10, 2021

(54) EUROPIUM-ACTIVATED ALKALINE-EARTH CHLOROAPATITE PHOSPHOR AND LIGHT-EMITTING DEVICE THEREOF

(71) Applicants: KABUSHIKI KAISHA TOSHIBA, Tokyo (JP); TOSHIBA MATERIALS CO., LTD., Yokohama (JP)

(72) Inventors: Naotoshi Matsuda, Chigasaki (JP); Tatsunori Itoga, Yokohama (JP); Masahiko Yamakawa, Yokohama (JP); Hirofumi Takemura, Kamakura (JP); Yasuhiro Shirakawa, Yokohama (JP)

(73) Assignee: Toshiba Materials Co., Ltd., Yokohama (JP)

( * ) Notice: Subject to any disclaimer, the term of this patent is extended or adjusted under 35 U.S.C. 154(b) by 23 days.

(21) Appl. No.: 16/375,050

(22) Filed: Apr. 4, 2019

(65) Prior Publication Data

US 2019/0233725 A1  Aug. 1, 2019

Related U.S. Application Data

(63) Continuation of application No. PCT/JP2017/036689, filed on Oct. 10, 2017.

(30) Foreign Application Priority Data

Oct. 11, 2016 (JP) .............................. JP2016-200188

(51) Int. Cl.
| | | |
|---|---|---|
| *C09K 11/77* | (2006.01) | |
| *H01L 33/50* | (2010.01) | |
| *C09K 11/73* | (2006.01) | |

(52) U.S. Cl.
CPC ........... *C09K 11/7711* (2013.01); *C09K 11/73* (2013.01); *H01L 33/50* (2013.01);
(Continued)

(58) Field of Classification Search
None
See application file for complete search history.

(56) References Cited

U.S. PATENT DOCUMENTS 3,509,065 A   4/1970 Palilla
10,160,905 B2  12/2018 Li
(Continued)

FOREIGN PATENT DOCUMENTS

EP   2 535 392 B1   9/2014
EP   2 953 174 A1   12/2015
(Continued)

OTHER PUBLICATIONS

International Search Report and Written Opinion (Application No. PCT/JP2017/036689) dated Nov. 28, 2017.
(Continued)

*Primary Examiner* — Daniel Whalen
(74) *Attorney, Agent, or Firm* — Burr & Brown, PLLC

(57) ABSTRACT

A phosphor according to an embodiment is a europium-activated alkaline-earth chloroapatite phosphor having a composition expressed by a composition formula: $(M_{1-x}Eu_x)_5(PO_4)_3Cl$, where M is an alkaline-earth element containing at least Sr and Ba, x is an atomic ratio satisfying $0.04 \leq x \leq 0.2$. In the phosphor of this embodiment, absorptance of light at a wavelength of 400 nm is 90% or more, and absorptance of light at a wavelength of 650 nm is 2% or less.

6 Claims, 3 Drawing Sheets

(52) U.S. Cl.
CPC .... H01L 33/502 (2013.01); *H01L 2933/0041* (2013.01); *Y02B 20/00* (2013.01)

(56) References Cited

U.S. PATENT DOCUMENTS

| | | |
|---|---|---|
| 2005/0145854 A1 | 7/2005 | Seto et al. |
| 2010/0237361 A1* | 9/2010 | Sakai ................ C09K 11/7734 257/88 |
| 2011/0182072 A1 | 7/2011 | Shimizu et al. |
| 2012/0212123 A1 | 8/2012 | Sakuta et al. |

FOREIGN PATENT DOCUMENTS

| | | |
|---|---|---|
| JP | 2004-253747 A1 | 9/2004 |
| JP | 3954304 B2 | 8/2007 |
| JP | 3985486 B2 | 10/2007 |
| JP | 4930649 B1 | 5/2012 |
| JP | 2015-183085 A1 | 10/2015 |
| JP | 2016-076652 A1 | 5/2016 |
| JP | 6017104 B1 | 10/2016 |
| WO | 2009/005035 A1 | 1/2009 |
| WO | 2011/105571 A1 | 9/2011 |
| WO | 2014/119313 A1 | 8/2014 |

OTHER PUBLICATIONS

Deressa et al., "Spectral broadening of blue $(Sr, Ba)_5(PO_4)_3Cl:Eu^{2+}$ phosphors by changing $Ba^{2+}/Sr^{2+}$ composition ratio for high color rendering index," Journal of Luminescence, vol. 161, pp. 347-351 (2015).
Korean Office Action (Application No. 10-2019-7013175) dated Sep. 10, 2020 (with English translation).
Korean Office Action (Application No. 10-2021-7008843) dated Apr. 29, 2021 (with English translation).

* cited by examiner

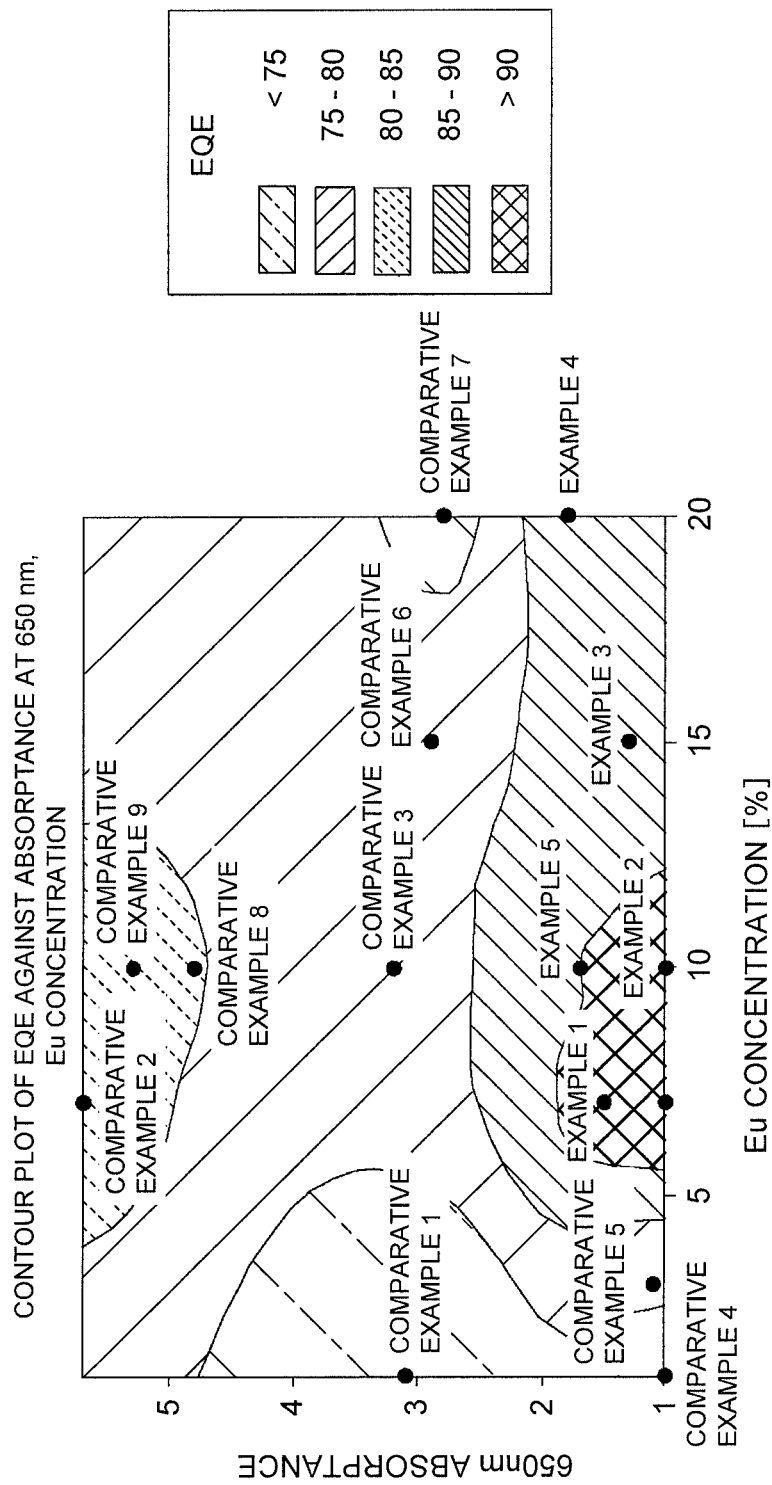

EUROPIUM-ACTIVATED ALKALINE-EARTH CHLOROAPATITE PHOSPHOR AND LIGHT-EMITTING DEVICE THEREOF

CROSS-REFERENCE TO RELATED APPLICATIONS

This application is a continuation of prior International Application No. PCT/JP2017/036689, filed on Oct. 10, 2017 which is based upon and claims the benefit of priority from Japanese Patent Application No. 2016-200188, filed on Oct. 11, 2016; the entire contents of all of which are incorporated herein by reference.

FIELD OF THE INVENTION

Embodiments of the present invention relate to a phosphor and a production method thereof, and a light-emitting device.

BACKGROUND OF THE INVENTION

A europium-activated apatite phosphor has a long history and has been widely used as a blue light-emitting component of a low-pressure mercury lamp or the like represented by a fluorescent lamp. In recent years, it is tried as a phosphor of a white light-emitting device (white LED) combined with a near-ultraviolet light-emitting diode, and a lot of proposals have been made. For example, in a light-emitting device where the near-ultraviolet LED and respective phosphors of blue, green, and red are combined, it is proposed to use a divalent europium-activated halophosphate phosphor represented by a general formula: $(M1, Eu)_{10}(PO_4)_6 \cdot Cl_2$ (where M1 is at least one element among Mg, Ca, Sr, and Ba) as the blue light-emitting phosphor.

Further, in a white semiconductor light-emitting element where the near-ultraviolet LED and respective phosphors of blue and yellow are combined, it has been proposed to use a halophosphate phosphor $(M1_{1-x}Eu_x)_{10}(PO_4)_6Cl2$ (where M1 is at least one among Ba, Sr, Ca, and Mg, and x satisfies 0<x<1) as the blue light-emitting phosphor. It has been proposed a white light-emitting device where the near-ultraviolet LED and respective phosphors of green and red, further a blue light-emitting phosphor having a composition expressed by $(Sr, Ca)_aBa_bEu_x(PO_4)_cX_d$, and defining light emission intensity at the wavelength of 490 nm are combined. It has been proposed a light-emitting device where a near-ultraviolet light-emitting element and a blue phosphor having a composition expressed by $Eu_aSr_bM_{5-a-b}(PO_4)_cX_d$, and quantum efficiency thereof is defined are combined.

As mentioned above, in a white LED where a near-ultraviolet to violet LED having a light emission peak wavelength of 390 to 420 nm and a blue light-emitting phosphor, a green and/or yellow light-emitting phosphor, a red light-emitting phosphor, or a blue light-emitting phosphor, a green and/or yellow light-emitting phosphor are combined, a europium-activated alkaline-earth chloroapatite phosphor expressed by a composition formula: $M_5(PO_4)_3Cl$:Eu is extremely useful as a blue light-emitting component.

At present, there are known a type where a blue light-emitting diode and a green and/or yellow light-emitting phosphor, and further a red phosphor in some cases, are combined (hereinafter, it is called Type 1), or a type where a near-ultraviolet to violet light-emitting diode and a blue, yellow, and red phosphors are combined (hereinafter, it is called Type 2) as a practically and widely used or tried white LED. At the present time, Type 1 is evaluated to be superior to Type 2 in high luminance and is the most widely used, but Type 2 has many kinds of usable phosphors and is superior in improving quality of white light such as a high color rendering property. Accordingly, its spread is expected as lighting for art gallery and museum which emphasize visibility of exhibits or lighting for stores which need to show exhibits vividly, and the like. Recently, it becomes apparent that there is a possibility where strong blue light emission contained in the white LED in Type 1 affects on a circadian rhythm of a human to deteriorate quality of sleep, and expectation for the white LED in Type 2 has been increasing.

In the white LED in Type 2, it is necessary to convert all of the near-ultraviolet to violet LED light into visible light with phosphors, and therefore, an amount used of the phosphors becomes large compared to the white LEI) in Type 1. Further, a part of the blue light emission has a tendency to be absorbed by the phosphors which emit light with a longer wavelength (green, yellow, orange, red, and the like), and a mixed ratio of the blue light-emitting phosphor becomes much more. Accordingly, it is strongly demanded to improve light emission efficiency of the blue light-emitting phosphor, that is, the apatite phosphor, in order to improve properties of the white LED and reduce the amount used of the phosphors.

The light emission efficiency of the phosphor is expressed by a product of two elements of internal quantum efficiency (IQE) representing conversion efficiency of phosphor materials and absorptance of excitation light. The light emission efficiency is a total index representing the efficiency of the light emission and is also called external quantum efficiency (EQE). When it is just stated as quantum efficiency, the external quantum efficiency is indicated. It is effective to increase a concentration of Eu being an activator in order to increase the absorptance of the apatite phosphor, but it is known that the internal quantum efficiency generally decreases when an activator concentration increases. It is necessary to improve two property factors in a tradeoff relation as stated above in order to improve the light emission efficiency of the phosphor. The apatite phosphor where a concentration of europium being an activator is increased, and the high internal quantum efficiency is kept even in a region with large absorptance is demanded.

BRIEF DESCRIPTION OF THE DRAWINGS

FIG. 3 is a view illustrating a relation between absorptance of each of phosphors of Examples and Comparative Examples at 650 nm, and an Eu concentration and light emission efficiency (EQE) when the phosphor is excited with light at a wavelength of 400 nm.

DETAILED DESCRIPTION OF THE INVENTION

Figure 1:
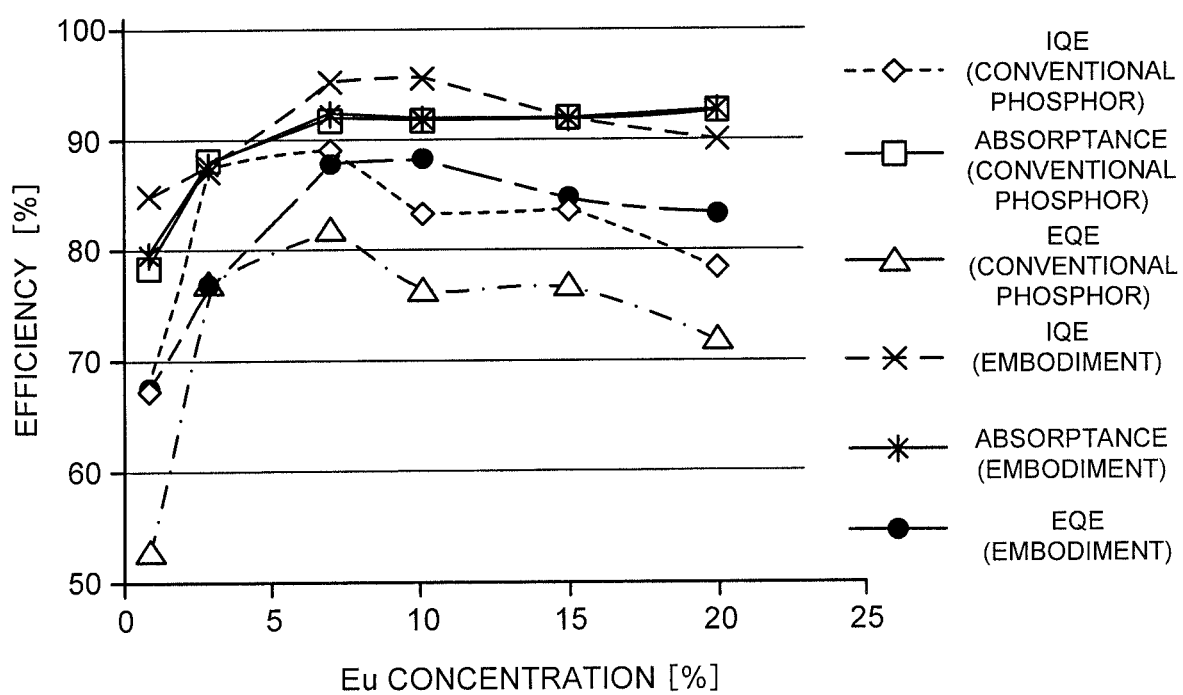
FIG. 1 is a view illustrating light emission properties of a phosphor according to an embodiment and an Eu concentration while comparing with a conventional phosphor.

A phosphor according to an embodiment is a europium-activated alkaline-earth chloroapatite phosphor having a composition expressed by:

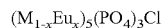 a composition formula where M is an alkaline-earth element containing at least Sr and Ba, x is an atomic ratio satisfying 0.04≤x≤0.2. In the phosphor of this embodiment, absorptance for light at a wavelength of 400 nm is 90% or more, and absorptance for light at a wavelength of 650 nm is 2% or less.

Hereinafter, embodiments of a phosphor according to the present invention and a production method thereof, and a light-emitting device using the phosphor are explained.

A europium-activated alkaline-earth chloroapatite phosphor of the embodiment has a composition expressed by a composition formula:

$$(M_{1-x}Eu_x)_5(PO_4)_3Cl \quad (1)$$

where M is an alkaline-earth element containing at least Sr and Ba, x is an atomic ratio satisfying $0.04 \leq x \leq 0.2$.

As a result of various experiments, the present inventors found that a phosphor which maintains internal quantum efficiency higher than conventional one was obtained even in a region with large absorptance by increasing a concentration of europium being an activator by performing a burning process in a highly reducing atmosphere in addition to a burning step when the phosphor was produced. Further, the inventors found that the relatively high internal quantum efficiency widely existed in a region where absorptance of visible light in a long wavelength region was low. That is, in the europium-activated alkaline-earth chloroapatite phosphor of this embodiment, an europium concentration is 4 mol % or more for the sum of an alkaline-earth element M and europium, a reflectance for an excitation wavelength is less than 10%, a diffuse reflectance corresponding to base material coloring with enough longer wavelength than a light emission wavelength is 98% or more.

In the europium-activated alkaline-earth chloroapatite phosphor, it is effective to increase the europium concentration in order to increase the absorptance of excitation light of near-ultraviolet to blue-violet excitation light at the wavelength of 390 to 420 nm. Concretely, it is effective to set the europium concentration for the sum of the alkaline-earth element M and europium to 4 mol % or more. It is thereby possible to set the diffuse reflectance for light at the wavelength of 400 nm to less than 10%, that is, to set absorptance of the light at the wavelength of 400 nm to 90% or more.

Meanwhile, the present inventors found that there was a correlation between absorptance of light in a long wavelength region, for example, at the wavelength of 650 nm where effects of absorption and light-emission by europium can be ignored, and internal quantum efficiency. That is, high internal quantum efficiency can be enabled, and high light emission efficiency can be thereby obtained by setting the absorptance of the light at the wavelength of 650 nm to 2% or less, in other words, setting the diffuse reflectance for the light at the wavelength of 650 nm to 98% or more.

As mentioned above, the europium-activated alkaline-earth chloroapatite phosphor of this embodiment includes 90% or more of the absorptance of light at the wavelength of 400 nm and 2% or less of the absorptance of the light at the wavelength of 650 nm. That is, the high internal quantum efficiency is enabled by setting the absorptance of the light in the long wavelength region where the effects of the absorption and the light emission by europium can be ignored, concretely, the light at the wavelength of 650 nm to 2% or less, in addition to setting the europium concentration for the sum of the alkaline-earth element M and europium to 4 mol % or more, and setting the absorptance of the light at the wavelength of 400 nm being representative blue-violet excitation light to 90% or more. It is thereby possible to provide the europium-activated alkaline-earth chloroapatite phosphor exhibiting the high light emission efficiency.

In the europium-activated alkaline-earth chloroapatite phosphor of this embodiment, the europium concentration is 4 mol % or more (it is 0.04 or more as a value (atomic ratio) of x in the formula (1)) for the sum of the alkaline-earth element M and europium as stated above. It is thereby possible to increase the absorptance of the light at the wavelength of 400 nm. Further, the europium concentration is preferably 7 mol % or more (x: 0.07 or more) for the sum of the alkaline-earth element M and europium so as to further increase the absorptance of the light at the wavelength of 400 nm. Note that the europium concentration is preferably 20 mol % or less (x: 0.20 or less), more preferably 17 mol % or less (x: 0.17 or less), and further preferably 12 mol % or less (x: 0.12 or less) for the sum of the alkaline-earth element M and europium because light emission luminance decreases if the europium concentration becomes too high.

In the europium-activated alkaline-earth chloroapatite phosphor of this embodiment, the element M is the alkaline-earth element containing at least strontium (Sr) and barium (Ba). The element M may contain magnesium (Mg) and calcium (Ca) each being the alkaline-earth element in addition to Sr and Ba. Note that a total content of Mg and Ca is preferably 2 mol % or less for the sum of the alkaline-earth element M and europium because light emission properties or the like as the alkaline-earth chloroapatite phosphor decreases when contents of Mg and Ca increase. A content ratio of Sr and Ba is not particularly limited, but it is preferable that the Ba content is set to fall in a range of 5 to 80 mol % for the sum of the alkaline-earth element M and europium, and the remainder except Eu is Sr or a mixture of Sr and a small amount of Ma and/or Ca in order to improve the light emission properties.

FIG. 1 illustrates property values of light emission properties of the phosphor of this embodiment, that is, the absorptance at the excitation wavelength of 400 nm (a solid line), the internal quantum efficiency (IQE/a dotted line), and the light emission efficiency (EQE/a dot and dash line) against the europium concentration. FIG. 1 also illustrates property values of a conventional phosphor. The absorptance of the europium-activated alkaline-earth chloroapatite phosphor $((M_{1-x}Eu_x)_5(PO_4)_3Cl$ (where M is the alkaline-earth element containing at least Sr and Ba)) becomes higher as the concentration increases in a region where the europium concentration (in FIG. 1, x×100 in the above-stated composition formula is represented as the europium concentration (%)) is low, to be a maximum value at about 7%, and is kept until the concentration is about 20%. Behavior of the absorptance as stated above against the europium concentration is approximately the same also in the conventional phosphor.

Meanwhile, the internal quantum efficiency (IQE) exhibits a maximum value when the europium concentration is in the vicinity of 5 to 10%, and gradually decreases as the europium concentration increases. Both the phosphor of this embodiment and the conventional phosphor exhibit such IQE tendencies, but the phosphor of this embodiment constantly exhibits the higher value (IQE value) compared to the conventional phosphor, and the internal quantum efficiency keeps an extremely high value of 90% also in a region where the europium concentration is high concentration to be 20%. The conventional europium-activated alkaline-earth chloroapatite phosphor has been recognized to have a property that the light emission efficiency (EQE) obtained as a product of the absorptance and the internal quantum efficiency exhibits a peak value when the europium concentration is 5 to 10%, and then gradually decreases. However, in the phosphor of this embodiment, the internal quantum efficiency shows the high value (90% or more) over a wide range of the europium concentration, and the light emission efficiency thereby keeps the high value.

Conventionally, causes why the internal quantum efficiency decreases as the europium concentration becomes high are considered that the activator in itself is an impurity for phosphor crystals, and a size difference with an element ion which is replaced by a europium ion and a crystal defect such as distortion occurs due to the size difference, and a crystal defect occurs in accordance with a case when a valence of the activator element ion is different from a valence of the element ion to be replaced, and the like. These defects in themselves affect a light emission process to cause effects of lowering of efficiency, removing light necessary for determining efficiency from the process due to coloring or the like.

In the phosphor of this embodiment, though a cause why the high internal quantum efficiency is kept for a wide range of the europium concentration is not necessarily certain, it is conceivable that the europium ions are almost unified to be +divalent ions being a desirable valence owing to multistage burning while controlling an atmosphere, which results in increase in effective activators contributing to the light emission process when it is seen from a production method of the phosphor of this embodiment. Further, it is conceivable that mismatching with the valence of the element ion which is replaced by the europium ion does not exist, and coloring resulting from the crystal defect decreases. The phosphor of this embodiment shows properties obviously superior to the conventional phosphor in the light emission properties.

In the above-described embodiment, the absorptance of the light at the wavelength of 400 nm of the phosphor exhibits a value measured as described below. That is, light from a light source such as a xenon lamp is split to be monochromatic light at the wavelength of 400 nm, with a full width at half maximum of 10 nm or less, irradiated on a standard white sample such as Spectralon and barium sulfate powder, diffuse reflection light from the white sample is collected by using an integrating sphere, and a photon number in a wavelength region of irradiation light around the wavelength of 400 nm is measured to be set as a photon number of incident light. Next, a phosphor sample is placed instead of the white sample, the diffuse reflection light when the monochromatic light at the wavelength of 400 nm is irradiated is similarly collected by using the integrating sphere, a photon number in the wavelength region of the irradiation light is measured to be set as a photon number of reflected light of the sample. A number where the photon number of the reflected light is subtracted from the photon number of the incident light is an absorption photon number, and a value of the absorptance of the light at the wavelength of 400 nm can be obtained by dividing the absorption photon number by the photon number of the incident light. The measurement can be carried out by using, for example, a spectrometer such as a C9920 type absolute PL quantum yield measuring system manufactured by Hamamatsu Photonics K.K.

The absorptance for the light at the wavelength of 650 nm of the phosphor exhibits a value measured as follows. That is, light from a light source such as a xenon lamp is split to be monochromatic light at the wavelength of 650 nm, with a full width at half maximum of 10 nm or less, irradiated on a standard white sample, diffuse reflection light from the white sample is collected by using an integrating sphere, and a photon number in a wavelength region of irradiation light around the wavelength of 650 nm is measured to be set as a photon number of incident light. Next, a phosphor sample is placed instead of the white sample, the diffuse reflection light when the monochromatic light at the wavelength of 650 nm is irradiated is similarly collected by using the integrating sphere, a photon number in the wavelength region of the irradiation light is measured to be set as a photon number of reflected light of the sample. A number where the photon number of the reflected light is subtracted from the photon number of the incident light is an absorption photon number as same as the case at the wavelength of 400 nm, and a value of absorptance of the light at the wavelength of 650 nm can be obtained by dividing the absorption photon number by the photon number of the incident light.

Next, the production method of the phosphor of this embodiment is explained. The production method of this embodiment is characterized in that a phosphor is produced through multistage burning while controlling an atmosphere in order to obtain the above-stated phosphor of this embodiment. When the europium-activated apatite phosphor is produced, the burning in a reducing atmosphere is essential because the valence of the europium ion is necessary to be divalent. However, the present inventors found that when the europium concentration is high, the absorption in a long wavelength region became large, that is, the internal quantum efficiency became low even if the apatite phosphor is directly synthesized in the reducing atmosphere. Further, the present inventors found that absorption in the long wavelength region can be suppressed and the apatite phosphor with high internal quantum efficiency can be fabricated by performing the burning in the reducing atmosphere at high temperature after generating apatite crystals in an atmosphere containing oxygen such as an air atmosphere.

The production method of the phosphor of this embodiment includes: a step of obtaining a raw material mixture by mixing europium oxide, alkaline-earth metal hydrogen phosphate, alkaline-earth metal chloride, and alkaline-earth metal carbonate; a step of obtaining a first burned product by burning the raw material mixture in an atmosphere containing oxygen at a temperature range of 800° C. or more and 1200° C. or less; and a step of obtaining the europium-activated alkaline-earth chloroapatite phosphor by burning the first burned product in a mixed gas atmosphere containing hydrogen of 1 vol % or more and 90 vol % or less and inert gas at the temperature of 1000° C. or more and 1400° C. or less. Hereinafter, the production method of the phosphor is explained in detail.

First, compounds with a purity of 3N or more such as barium carbonate ($BaCO_3$), strontium carbonate ($SrCO_3$), barium hydrogen phosphate ($BaHPO_4$), strontium hydrogen phosphate ($SrHPO_4$), barium chloride ($BaCl_2.2H_2O$), strontium chloride ($SrCl_2.6H_2O$), europium oxide ($Eu_2O_3$) are used as starting raw materials. A combination of the raw materials is not limited thereto, and compounds of calcium and magnesium each being the alkaline-earth metal as same as barium and strontium may be contained slightly. A limit thereof is about 2 mol % for a sum of the alkaline-earth element and europium.

The starting raw materials are weighed to be a predetermined molar ratio of the phosphor. At this time, since the chloride of the alkaline-earth metal also functions as a flux, chlorine is preferably contained in an excessive amount twice to four times as much as an amount calculated from a composition of apatite, and the alkaline-earth element and europium are also preferably increased in amount according thereto. These starting raw materials are mixed by means of dry-mixing using a V-blender as a simple way in order to obtain a raw material mixture. It goes without saying that it is possible to carry out the dry-mixing after all of or a part of the starting raw materials are wet-mixed.

Next, the obtained raw material mixture is filled in, for example, an alumina crucible, and burned in an atmosphere containing oxygen, at the temperature of 800° C. or more and 1200° C. or less, for two to eight hours. The burning temperature is more preferably 900° C. or more and 1100° C. or less. The burning time is more preferably three to six hours. The air or a mixed gas atmosphere such as inert gas containing a few % of oxygen can be used as the burning atmosphere containing oxygen (first burning step).

Next, a product obtained through the first burning step (first burned product) is burned in a mixed gas atmosphere of hydrogen and inert gas, at the temperature of 1000° C. or more and 1400° C. or less, for two to eight hours (second burning step). At this times, in the second burning step, the first burned product may be burned in a state as it is or may be burned by filling in the alumina crucible after once the first burned product is taken out of the alumina crucible, and then disintegrating the product. The burning in the reducing atmosphere may be performed repeatedly such that a third burning step is further performed.

In the burning step in the reducing atmosphere, examples of the inert gas include nitrogen, rare gas such as argon, and the inert gas is used independently or mixed gas of the above is used. In the mixed gas of hydrogen and the inert gas, a ratio of hydrogen is set to a range of 1 to 90% in a volume ratio (%). When the ratio of hydrogen is less than 1%, the reducing atmosphere becomes insufficient, and the valence of the europium ion cannot be sufficiently set to divalent. When the ratio of hydrogen exceeds 90%, the properties of the phosphor deteriorate. The volume ratio of hydrogen is more preferably 5 to 80%. The second burning step is more preferably performed at the temperature of 1100 to 1300° C. for three to six hours.

Since there is a case when a residue such as alkaline-earth chloride as the flux is contained in the burned product obtained through the first and second burning steps, it is preferable to remove the residue by water-washing. At this time, it is more preferable to use hot-water because the removal of the flux is accelerated. The europium-activated alkaline-earth chloroapatite phosphor of this embodiment is obtained by subjecting the water-washed burned product to filtration, drying, and further sieving.

The phosphor obtained as stated above emits bright blue light, concretely, emits blue light with the light emission efficiency of 83% or more when it is excited by near-ultraviolet to blue-violet light having a peak wavelength of 390 nm or more and 420 nm or less. The peak wavelength of the blue light emission is in a range of 445 nm or more and 465 nm or less. An average particle size of the phosphor is in a range of 10 to 40 µm, and it can be controlled by mainly changing the burning temperatures and times of the first and second burning steps. The average particle size is a value of 50% value of a particle size distribution obtained by dry laser diffractometry (Helos & Rodos). When the phosphor is excited with the near-ultraviolet to blue-violet light having the peak wavelength of 390 to 420 nm, there is a tendency that luminance becomes higher as the particle size is larger, and in this case, the average particle size is more preferably in a range of 20 to 35 µm.

Figure 2:
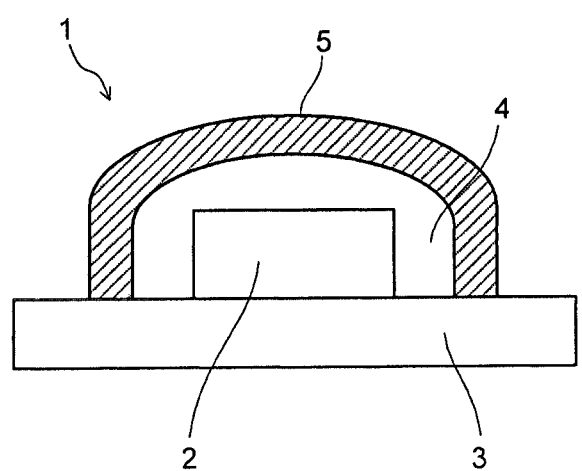
FIG. 2 is a view illustrating a configuration of a light-emitting device according to the embodiment.

The europium-activated alkaline-earth chloroapatite phosphor (blue phosphor) of this embodiment is used for, for example, a light-emitting part of a light-emitting device. FIG. 2 illustrates a configuration of a packaged white light-emitting device as an example of a light-emitting device of this embodiment. A white light-emitting device 1 illustrated in FIG. 2 includes an LED chip 2 which emits near-ultraviolet to blue-violet light having a peak wavelength in a range of 390 nm or more and 420 nm or less, a base part 3 where the LED chip 2 is placed, a transparent resin layer 4 which is provided to cover the LED chip 2, and a phosphor layer 5 as a light-emitting part which is provided on the transparent resin part 4.

The phosphor layer 5 as the light-emitting part contains the europium-activated alkaline-earth chloroapatite phosphor of this embodiment as the blue phosphor. Further, when the phosphor layer 5 is used as the light-emitting part of white light, the phosphor layer 5 contains a yellow phosphor in addition to the blue phosphor so that white light is emitted from the phosphor layer 5 when the near-ultraviolet to blue-violet light emitted from the LED chip 2 is irradiated on the phosphor layer 5. The phosphor layer 5 may contain the blue phosphor, a green or yellow phosphor, and a red phosphor. Various publicly-known phosphors can be used as other phosphors than the blue phosphor, and compositions or the like of other phosphors are not particularly limited.

For example, an example of the phosphor layer 5 includes a mixed layer of a phosphor and a resin. The phosphor layer 5 is formed by, for example, coating and curing the mixture of the phosphor and the resin (phosphor paste) on the transparent resin layer 4. The transparent resin layer 4 is the layer formed according to need, and the formation thereof may be omitted. When the peak wavelength of the LED chip 2 is in the range of 390 to 420 nm, leakage of ultraviolet ray can be reduced by providing the transparent resin layer 4, and it is possible to reduce effects on a human body and to suppress deterioration of peripheral members. The phosphor layer 5 may be formed by putting a molded body which is formed by molding the phosphor paste into a cap shape on the LED chip 2 without being limited to the production method where the phosphor paste is coated and cured.

FIG. 2 illustrates a structure where one phosphor layer 5 is provided at one LED chip 2 (one-chip type white light-emitting device), but the structure is not limited thereto and may be a structure where a plurality of LED chips are covered with a phosphor layer (multi-chip type white light-emitting device). Other components such as a lens and a cover may be attached to the white light-emitting device 1 according to need. The phosphor layer 5 may be formed by filling into a recessed member or a cylindrical member functioning as a reflector or the like. In this case, the LED chip 2 is located in the recessed member or the cylindrical member.

EXAMPLES

Next, concrete examples of the present invention and evaluation results thereof are explained.
(Raw Material Powder Composition)

When phosphors of Examples 1 to 6 and Comparative Examples 1 to 9 described below were fabricated, respective powders of europium oxide ($Eu_2O_3$), barium hydrogen phosphate ($BaHPO_4$), barium carbonate ($BaCo_3$), barium chloride ($BaCl_2 \cdot 2H_2O$), strontium hydrogen phosphate ($SrHPO_4$), strontium carbonate ($SrCo_3$), strontium chloride ($SrCl_2 \cdot 6H_2O$), further calcium chloride ($CaCl_2$) each with a purity of 3N or more were used as raw materials. These respective raw material powders were weighed such that an element ratio at an $(M_{1-x}Eu_x)$ part in a composition formula: $(M_{1-x}Eu_x)_5(PO_4)_3Cl$ became each ratio listed in Table 1 into the same plastic bag. These were mixed in each plastic bag to be used as a raw material mixture. In the following, a value of [x×100(%)] is shown as a europium (Eu) concentration[%].

TABLE 1

| COMPARATIVE EXAMPLE | EXAMPLE | USED RAW MATERIAL | $M_{1-y}Eu_y$ COMPOSITION | | | |
|---|---|---|---|---|---|---|
| | | | Eu (x) | Ba | Sr | Ca |
| — | 1, 4 | $Eu_2O_3$, $BaHPO_4$, $BaCO_3$, $BaCl_2 \cdot 2H_2O$, $SrHPO_4$, $SrCO_3$, $SrCl_2 \cdot 6H_2O$, $CaCl_2$ | 0.01 | 0.39 | 0.59 | 0.01 |
| — | 5 | $Eu_2O_3$, $BaHPO_4$, $BaCO_3$, $BaCl_2 \cdot 2H_2O$, $SrHPO_4$, $SrCO_3$, $SrCl_2 \cdot 6H_2O$ | 0.03 | 0.13 | 0.84 | 0 |
| 1, 6 | 2 | | 0.07 | 0.13 | 0.80 | 0 |
| 2.5 | 3, 8, 9 | | 0.10 | 0.13 | 0.77 | 0 |
| 3 | 6 | | 0.15 | 0.13 | 0.72 | 0 |
| 4 | 7 | | 0.20 | 0.13 | 0.67 | 0 |

Example 1/Eu Concentration: 7%

The raw material mixture was filled in an alumina crucible and burned in an air atmosphere at 1000° C. for five hours. Next, the obtained burned product while being filled in the alumina crucible was burned in a mixed atmosphere of 50 vol % of hydrogen and 50 vol % of nitrogen at 1200° C. for five hours. This burned product was water-washed to obtain a phosphor powder of Example 1. Absorptance of light at 400 nm of this phosphor was 92%, and absorptance of light at 650 nm was 1.5%. A peak wavelength when excited at the wavelength of 400 nm emitted blue light at 454 nm, and light-emission efficiency was a value as high as 88%.

Example 2/Eu Concentration: 10%

The raw material mixture was filled in an alumina crucible and burned in an air atmosphere at 1000° C. for five hours. Next, the obtained burned product while being filled in the alumina crucible was burned in a mixed atmosphere of 50 vol % of hydrogen and 50 vol % of nitrogen at 1200° C. for five hours. This burned product was water-washed to obtain a phosphor powder of Example 2. Absorptance of light at 400 nm of this phosphor was 92%, and absorptance of light at 650 nm was 1%. A peak wavelength when excited at the wavelength of 400 nm emitted blue light at 455 nm, and light-emission efficiency was a value as high as 88%.

Example 3/Eu Concentration: 15%

After the first burning was performed under the same condition as Example 1, the first burned product while being filled in the alumina crucible was subjected to the second burning under a condition in a mixed atmosphere of 5 vol % of hydrogen and 95 vol % of nitrogen at 1000° C. for five hours. The second burned product while being filled in the alumina crucible was subjected to a third burning under a condition in a mixed atmosphere of 50 vol % of hydrogen and 50 vol % of nitrogen, at 1200° C., for five hours. The burned product was water-washed to obtain a phosphor powder of Example 3. Absorptance of light at 400 nm of this phosphor was 92%, and absorptance of light at 650 nm was 1.3%. A peak wavelength when excited at the wavelength of 400 nm emitted blue light at 456 nm, and light-emission efficiency was a value as high as 84%.

Example 4/Eu Concentration: 20%

Three times of multistage burnings were performed under the same condition as Example 3 except that the Eu concentration was set to 20%. The burned product was water-washed to obtain a phosphor powder of Example 4. Absorptance of light at 400 nm of this phosphor was 92%, and absorptance of light at 650 nm was 1.8%. A peak wavelength when excited at the wavelength of 400 nm emitted blue light at 458 nm, and light-emission efficiency was a value as high as 83%.

Example 5/Eu Concentration: 10%

Three times of multistage burnings were performed under the same condition as Example 3 except that the Eu concentration was set to 10%. The burned product was water-washed to obtain a phosphor powder of Example 5. Absorptance of light at 400 nm of this phosphor was 92%, and absorptance of light at 650 nm was 1.7%. A peak wavelength when excited at the wavelength of 400 nm emitted blue light at 455 nm, and light-emission efficiency was a value as high as 85%.

Example 6/Eu Concentration: 7%

Two times of burnings were performed under the same condition as Example 1 except that the second burning atmosphere was set to a mixed atmosphere of 5 vol % of hydrogen and 95 vol % of nitrogen. The burned product was water-washed to obtain a phosphor powder of Example 6. Absorptance of light at 400 nm of this phosphor was 92%, and absorptance of light at 650 nm was 1.0% or less. A peak wavelength when excited at the wavelength of 400 nm emitted blue light at 455 nm, and light-emission efficiency was a value as high as 90%.

Comparative Example 1/Eu Concentration: 1%

The raw material mixture was filled in an alumina crucible and burned in a nitrogen atmosphere containing 5 vol % of hydrogen at 1200° C. for five hours. This burned product was water-washed to obtain a phosphor powder of Comparative Example 1. Absorptance of light at 400 nm of this phosphor was 78%, and absorptance of light at 650 nm was 3.1%. A peak wavelength, when excited at the wavelength of 400 nm, emitted blue light at 450 nm, but light-emission efficiency (EQE) was a value as low as 53% because the absorptance was low.

Comparative Example 2/Eu Concentration: 7%

The raw material mixture was filled in an alumina crucible and burned in a nitrogen atmosphere containing 5 vol % of hydrogen at 1200° C. for five hours. This burned product was water-washed to obtain a phosphor powder of Comparative Example 2. Absorptance of light at 400 nm of this phosphor was 92%, and the absorptance of light at 650 nm was 5.7%. A peak wavelength when excited at the wavelength of 400 nm emitted blue light at 454 nm, and light-emission efficiency was 82% which was improved compared to Comparative Example 1, but it was still an insufficient value.

Comparative Example 3/Eu Concentration: 10%

The raw material mixture was filled in an alumina crucible and burned in a nitrogen atmosphere containing 5 vol % of hydrogen at 1200° C. for five hours. This burned product was water-washed to obtain a phosphor powder of Comparative Example 3. Absorptance of light at 400 nm of this phosphor was 91% to be an equivalent value as Comparative Example 2. Absorptance of light at 650 nm was 3.2%. A peak wavelength when excited at the wavelength of 400 nm emitted blue light at 454 nm, and light-emission efficiency was 76% which was lower than Comparative Example 2.

Comparative Example 4/Eu Concentration: 1%

Two times of burnings were performed under the same condition as Example 1 except that the Eu concentration was set to 1%, and the burned product was water-washed to obtain a phosphor powder of Comparative Example 4. Absorptance of light at 400 nm of this phosphor was 79%, and absorptance of light at 650 nm was 1.0%. A peak wavelength when excited at the wavelength of 400 nm emitted blue light at 450 nm, and light-emission efficiency was a value as low as 67% because the Eu concentration was made low.

Comparative Example 5/Eu Concentration: 3%

Two times of burnings were performed under the same condition as Example 1 except that the Eu concentration was set to 3% and the burned product was water-washed to obtain a phosphor powder of Comparative Example 5. Absorptance of light at 400 nm of this phosphor was 88%, and absorptance of light at 650 nm was 1.1%. A peak wavelength when excited at the wavelength of 400 nm emitted blue light at 451 nm which is improved than Comparative Example 4, but light-emission efficiency was a value as low as 76% because the Eu concentration was decreased.

Comparative Example 6/Eu Concentration: 15%

The burning was performed under the same condition as Comparative Example 1 except that the Eu concentration was set to 15%, and the burned product was water-washed to obtain a phosphor powder of Comparative Example 6. Absorptance of light at 400 nm of this phosphor was 92%, and absorptance of light at 650 nm was 2.9%. A peak wavelength when excited at the wavelength of 400 nm emitted blue light at 455 nm. The Eu concentration was increased, but light-emission efficiency was a value as low as 77%.

Comparative Example 7/Eu Concentration: 20%

The burning was performed under the same condition as Comparative Example 1 except that the Eu concentration was set to 20%, and the burned product was water-washed to obtain a phosphor powder of Comparative Example 7. Absorptance of light at 400 nm of this phosphor was 92%, and the absorptance of light at 650 nm was 2.8%. A peak wavelength when excited at the wavelength of 400 nm emitted blue light at 457 nm, and light-emission efficiency was 72% to be lower than Comparative Example 6 due to the higher Eu concentration though it was not certain.

Comparative Example 8/Eu Concentration: 10%

The burning was performed under the same condition as Comparative Example 3 except that the atmosphere of the first burning was set to the nitrogen atmosphere containing 50 vol % of hydrogen, and the burned product was water-washed to obtain a phosphor powder of Comparative Example 8. Absorptance of light at 400 nm of this phosphor was 92%, and the absorptance of light at 650 nm was 4.8%. A peak wavelength, when excited at the wavelength of 400 nm, emitted blue light at 453 nm, but light-emission efficiency was 80% which was a still insufficient value though it was improved compared to Comparative Example 3.

Comparative Example 9/Eu Concentration: 10%

The burnings were performed under the same condition as Example 2 except that the atmosphere of the first burning was set to the nitrogen atmosphere containing 5 vol % of hydrogen, and the burned product was water-washed to obtain a phosphor powder of Comparative Example 9. Absorptance of light at 400 nm of this phosphor was 92%, and absorptance of light at 650 nm was 5.3%. A peak wavelength, when excited at the wavelength of 400 nm, emitted blue light at 454 nm, but light-emission efficiency was 81% different from the high value such as Example 2 to be an insufficient value because the atmosphere of the first burning was set to the atmosphere not containing oxygen.

Table 2 lists production conditions of the phosphors shown in Examples and Comparative Examples. Table 3 lists light emission properties of the phosphors obtained in Examples and Comparative Examples.

TABLE 2

| | | | PRODUCTION CONDITIONS | | | | | | | |
|---|---|---|---|---|---|---|---|---|---|---|
| | | FIRST BURNING | | | SECOND BURNING | | | THIRD BURNING | | |
| | Eu CONCENTRATION [%] | NUMBER OF BURNING TIMES | ATMOS-PHERE | TEMPER-ATURE [° C.] | TIME [h] | ATMOS-PHERE | TEMPER-ATURE [° C.] | TIME [h] | ATMOS-PHERE | TEMPER-ATURE [° C.] | TIME [h] |
| E1 | 7 | 2 | AIR | 1000 | 5 | 50% H/N | 1200 | 5 | — | — | — |
| E2 | 10 | 2 | AIR | 1000 | 5 | 50% H/N | 1200 | 5 | — | — | — |
| E3 | 15 | 3 | AIR | 1000 | 5 | 5% H/N | 1000 | 5 | 50% H/N | 1200 | 5 |
| E4 | 20 | 3 | AIR | 1000 | 5 | 5% H/N | 1000 | 5 | 50% H/N | 1200 | 5 |

TABLE 2-continued

| | | | PRODUCTION CONDITIONS | | | | | | | |
|---|---|---|---|---|---|---|---|---|---|---|
| | | | FIRST BURNING | | | SECOND BURNING | | | THIRD BURNING | | |
| | Eu CONCENTRATION [%] | NUMBER OF BURNING TIMES | ATMOS-PHERE | TEMPER-ATURE [° C.] | TIME [h] | ATMOS-PHERE | TEMPER-ATURE [° C.] | TIME [h] | ATMOS-PHERE | TEMPER-ATURE [° C.] | TIME [h] |
| E5 | 10 | 3 | AIR | 1000 | 5 | 5% H/N | 1000 | 5 | 50% H/N | 1200 | 5 |
| E6 | 7 | 2 | AIR | 1000 | 5 | 5% H/N | 1200 | 5 | — | — | — |
| CE1 | 1 | 1 | 5% H/N | 1200 | 5 | — | — | — | — | — | — |
| CE2 | 7 | 1 | 5% H/N | 1200 | 5 | — | — | — | — | — | — |
| CE3 | 10 | 1 | 5% H/N | 1200 | 5 | — | — | — | — | — | — |
| CE4 | 1 | 2 | AIR | 1000 | 5 | 50% H/N | 1200 | 5 | — | — | — |
| CE5 | 3 | 2 | AIR | 1000 | 5 | 50% H/N | 1200 | 5 | — | — | — |
| CE6 | 15 | 1 | 5% H/N | 1200 | 5 | — | — | — | — | — | — |
| CE7 | 20 | 1 | 5% H/N | 1200 | 5 | — | — | — | — | — | — |
| CE8 | 10 | 1 | 50% H/N | 1200 | 5 | — | — | — | — | — | — |
| CE9 | 10 | 2 | 5% H/N | 1000 | 5 | 50% H/N | 1200 | 5 | — | — | — |

E: EXAMPLE,
CE: COMPARATIVE EXAMPLE

TABLE 3

| | OPTICAL PROPERTIES | | | | |
|---|---|---|---|---|---|
| | LIGHT EMISSION PROPERTIES EXCITED AT 400 nm | | | | LONG WAVELENGTH REGION PROPERTY |
| | IQE [%] | ABSORP-TANCE [%] | EQE [%] | PEAK WAVELENGTH [nm] | (650 nm) ABSORPTANCE [%] |
| E1 | 95 | 92 | 88 | 454 | 1.5 |
| E2 | 96 | 92 | 88 | 455 | 1.0 |
| E3 | 92 | 92 | 84 | 456 | 1.3 |
| E4 | 90 | 92 | 83 | 458 | 1.8 |
| E5 | 93 | 92 | 85 | 455 | 1.7 |
| E6 | 98 | 92 | 90 | 455 | 1.0 |
| CE1 | 68 | 78 | 53 | 450 | 3.1 |
| CE2 | 89 | 92 | 82 | 454 | 5.7 |
| CE3 | 83 | 91 | 76 | 454 | 3.2 |
| CE4 | 85 | 79 | 67 | 450 | 1.0 |
| CE5 | 87 | 88 | 76 | 451 | 1.1 |
| CE6 | 84 | 92 | 77 | 455 | 2.9 |
| CE7 | 78 | 92 | 72 | 457 | 2.8 |
| CE8 | 87 | 92 | 80 | 453 | 4.8 |
| CE9 | 88 | 92 | 81 | 454 | 5.3 |

E: EXAMPLE,
CE: COMPARATIVE EXAMPLE

It is clear from Table 1 to Table 3 that the high light emission properties of the phosphors of Examples can be obtained when the europium concentration in a specific range (4% or more) is applied, the atmosphere containing oxygen such as the air is used as the first burning atmosphere, and further the burning is repeated in the highly reducing atmosphere not containing oxygen. The absorptance of the phosphor in the long wavelength region was surveyed as a data alternative to a definition of the phosphor under the production conditions. Table 3 also lists each measurement value of the absorptance of each phosphor at the wavelength of 650 nm.

FIG. 3 illustrates values of the light emission efficiency (EQE) of each phosphor in a contour line plot form while using the absorptance and the Eu concentration of each phosphor at the wavelength of 650 nm as variables. A contour map is divided into five regions of 90 or more, 85 to 90, 80 to 85, 75 to 80, 75 or less in EQE, and Examples and Comparative Examples to be grounds are illustrated. The phosphors of Examples each have the europium concentration of 4% or more, the absorptance at 650 nm is 2% or less, and exhibit high light emission efficiency. In particular, the high efficiency is obtained in the region where the europium concentration is 7 to 12% also in the region. Since the internal quantum efficiency (IQE) of the phosphor in this region is high, the near-ultraviolet light at 400 nm which is absorbed by the phosphor can be converted into the blue light almost with no loss.

In the contour map in FIG. 3, it is recognized that the light emission efficiency is relatively high in a part of regions where the absorptance of light at 650 nm is over 5%. Normally, light absorption of the phosphor in the long wavelength region does not exist, and the phosphor having low absorptance is desirable. Though the phosphor of this embodiment emits blue light at 450 nm, it is not used independently but combined with a yellow or red light-emitting phosphor. It is not preferable that the blue phosphor contained in the mixed phosphor absorbs light in the long wavelength region in the vicinity of 650 nm because efficiency of the light-emitting device decreases as a total.

Next, a white LED was fabricated by combining the blue light-emitting europium-activated alkaline-earth chloroapatite phosphor of Example 1, a violet LED having the peak wavelength of 405 nm, and a (Ba, Sr)$_2$SiO$_4$: Eu phosphor having the light-emission peak wavelength of 560 nm as a yellow phosphor. Similarly, a similar white LED was fabricated by using the blue light-emitting europium-activated alkaline-earth chloroapatite phosphor of Comparative Example 1. A ratio of the blue phosphor and the yellow phosphor was adjusted such that chromaticity of white light emitted from each white LED became (0.3, 0.3). Table 4 lists light emission properties of the white LEDs of Example and Comparative Example. The white LED using the blue phosphor of Example 1 exhibited light emission luminance of over 10% compared to the white LED using the blue phosphor of Comparative Example 1. The light emission luminances listed in Table 4 each are a relative value when the light emission luminance of Comparative Example is set to 100.

TABLE 4

|  | CONSTITUTION OF WHITE LED | WHITE CHROMATICITY | LIGHT EMISSION LUMINANCE (RELATIVE VALUE) |
|---|---|---|---|
| EXAMPLE | VIOLET LED + BLUE PHOSPHOR (E1) + YELLOW PHOSPHOR ((Ba, Sr)$_2$SiO$_4$: Eu) | (0.3, 0.3) | 115 |
| COMPARATIVE EXAMPLE | VIOLET LED + BLUE PHOSPHOR (CE1) + YELLOW PHOSPHOR ((Ba, Sr)$_2$SiO$_4$: Eu) | (0.3, 0.3) | 100 |

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A europium-activated alkaline-earth chloroapatite phosphor comprising a composition expressed by a composition formula of $(M_{1-x} Eu_x)_5(PO_4)_3Cl$, wherein M is an alkaline-earth element containing at least Sr and Ba, and x is an atomic ratio satisfying 0.07≤x≤0.17, wherein an absorptance of light at a wavelength of 400 nm is 90% or more, and an absorptance of light at a wavelength of 650 nm is 2% or less, and wherein a light emission efficiency of the phosphor excited by near-ultraviolet to blue-violet light, having a peak wavelength in a range of 390 nm or more and 420 nm or less, is 83% or more.

2. The phosphor according to claim 1, wherein in the composition formula, x is 0.07 or more and 0.12 or less.

3. The phosphor according to claim 1, wherein a light emission peak wavelength of the phosphor excited by near-ultraviolet to blue-violet light having a peak wavelength in a range of 390 nm or more and 420 nm or less is in a range of 445 nm or more and 465 nm or less.

4. A method for producing the europium-activated alkaline-earth chloroapatite phosphor according to claim 1, comprising:

mixing europium oxide, alkaline-earth metal hydrogen phosphate salt, alkaline-earth metal chloride, and alkaline-earth metal carbonate to obtain a raw material mixture;

burning the raw material mixture in an atmosphere containing oxygen at a temperature range of 800° C. or more and 1200° C. or less to obtain a first burned product; and burning the first burned product in a mixed gas atmosphere containing hydrogen of 1 vol % or more and 90 vol % or less and inert gas at a temperature of 1000° C. or more and 1400° C. or less to obtain the europium-activated alkaline-earth chloroapatite phosphor.

5. A light-emitting device, comprising:

a light-emitting part which includes the europium-activated alkaline-earth chloroapatite phosphor according to claim 1; and a semiconductor light-emitting element which irradiates near-ultraviolet to blue-violet light having a peak wavelength in a range of 390 nm or more and 420 nm or less on the light-emitting part.

6. The device according to claim 5, wherein the light-emitting part emits white light which is excited by the near-ultraviolet to blue-violet light emitted from the semiconductor light-emitting element.

* * * * *